United States Patent
Bras

(10) Patent No.: US 7,225,095 B2
(45) Date of Patent: May 29, 2007

(54) THERMAL PROCESSING EQUIPMENT CALIBRATION METHOD

(75) Inventor: Marléne Bras, Grenoble (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 11/214,616

(22) Filed: Aug. 29, 2005

(65) Prior Publication Data
US 2006/0284720 A1    Dec. 21, 2006

(30) Foreign Application Priority Data
Jun. 10, 2005   (EP)   ................... 05291261

(51) Int. Cl.
*G06F 19/00* (2006.01)
(52) U.S. Cl. ......................... 702/99; 702/85
(58) Field of Classification Search ................. 702/85, 702/99
See application file for complete search history.

(56) References Cited

U.S. PATENT DOCUMENTS

| | | | |
|---|---|---|---|
| 3,424,714 A | 1/1969 | Anspon et al. .......... 260/45.95 |
| 3,700,754 A | 10/1972 | Schmitt et al. ........... 260/878 R |
| 4,320,174 A | 3/1982 | Rabinovitch et al. ........ 428/518 |
| 4,935,275 A | 6/1990 | Ushida et al. ................ 428/31 |
| 5,512,620 A | 4/1996 | van Hout et al. ............. 524/84 |
| 5,662,469 A * | 9/1997 | Okase et al. .................... 432/6 |
| 5,674,579 A | 10/1997 | Ladouce et al. ............ 428/35.7 |
| 5,700,894 A | 12/1997 | Krieg et al. .............. 526/323.2 |
| 6,200,023 B1 | 3/2001 | Tay et al. .................... 374/161 |
| 6,329,643 B1 * | 12/2001 | Suzuki et al. ................ 219/497 |
| 6,395,100 B1 * | 5/2002 | Brennan et al. ............... 134/19 |
| 6,853,802 B2 | 2/2005 | Neyret et al. ................ 392/416 |
| 2004/0151483 A1 | 8/2004 | Neyret et al. ................ 392/416 |
| 2006/0228818 A1 | 10/2006 | Chacin et al. ................. 438/18 |

FOREIGN PATENT DOCUMENTS

| | | |
|---|---|---|
| DE | 195 22 118 C1 | 3/1997 |
| EP | 0 120 296 B1 | 6/1986 |
| EP | 0 827 981 A2 | 3/1998 |
| EP | 0 921 160 A1 | 6/1999 |
| GB | 974111 | 11/1964 |
| JP | 2001-217233 * | 10/2001 |
| WO | WO 01/16143 | 10/1991 |

OTHER PUBLICATIONS

Jeffrey C. Gelpey et al., XP-000885199, "Uniformity Characterization of An RTP System", Nuclear Instruments and Methods in Physics Research, vol. B21, pp. 612-617, (1997).

* cited by examiner

*Primary Examiner*—John Barlow
*Assistant Examiner*—Douglas N Washburn
(74) *Attorney, Agent, or Firm*—Winston & Strawn LLP

(57) ABSTRACT

The invention relates to a method for calibrating thermal processing equipment used for heat treatment of a multilayer substrate, in particular a multilayer semiconductor substrate. A calibration test profile is determined by processing a calibration test substrate according to thermal process parameters that produce multilayer substrates having an even thickness profile, and/or having reduced slip lines and/or reduced wafer deformation, and/or having other desired and predetermined properties. Then a particular thermal processing equipment is calibrated by determining thermal process parameters for that equipment so that a test substrate processed with these parameters will have the determined calibration test profile.

29 Claims, 6 Drawing Sheets

THERMAL PROCESSING EQUIPMENT CALIBRATION METHOD

FIELD OF THE INVENTION

Figure 1:
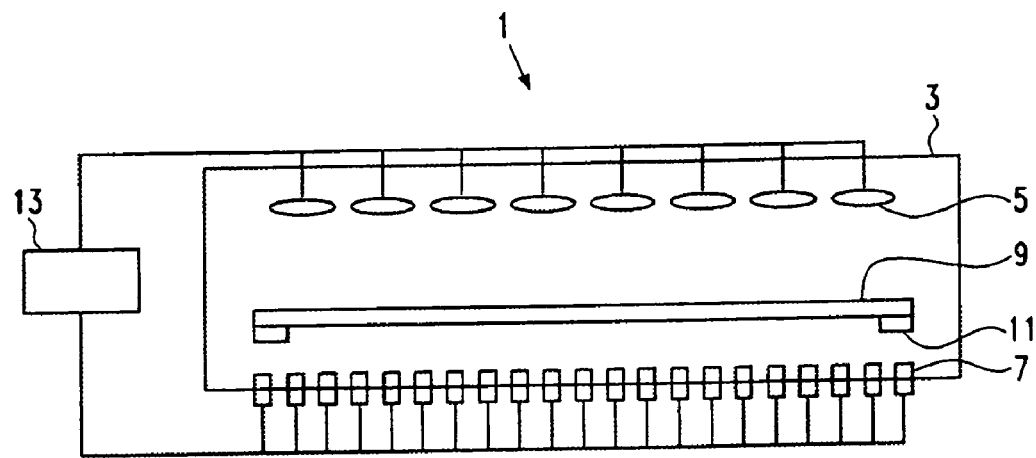

This invention relates to a method for calibrating thermal processing equipment comprising a heating device which is used for heat treatment of a multilayer substrate, in particular a semiconductor multilayer substrate. The invention furthermore relates to a calibration test substrate and a method for creating the calibration test substrate.

BACKGROUND

Thermal processing equipment is usually used for thermally treating semiconductor wafers in a hydrogen, argon or oxygen atmosphere, in order to, for example, form an oxide layer or to smooth the surface of a wafer. In order to achieve uniform temperature across the wafers, the equipment needs to be calibrated. For this purpose temperature sensors (or probes) are positioned below the wafer which is usually positioned horizontally in a furnace chamber. These sensors measure the local temperature of the wafer and are connected to a control system which causes the equipment to adapt locally the amount of heat provided to the wafer.

A typical method for calibrating such equipment when treating bulk silicon wafers consists of applying a rapid thermal oxidation to form about 100 Å of $SiO_2$ with an offset of "0" for all probes (or temperature sensors). Then an oxide thickness profile across the wafer is measured revealing any thermal non-uniformities within the chamber, since the actual oxidation thickness is dependent on the temperature. Afterwards the offset values are adapted to correct for temperature non-uniformity and the process is repeated until an oxide layer with a flat or even thickness profile is formed on the wafer produced, therefore, by a uniform temperature across the wafer.

Such a direct calibration of thermal processing equipment is, however, not applicable to multilayer type substrates, for example, silicon on insulator (SOI) wafers. US patent U.S. Pat. No. 6,853,802 describes the problem that SOI-like structures have a non-homogenous structure especially at edges thereby providing local differences in the heat absorption coefficients. Thus, when treating the substrate in the thermal processing equipment, this local difference has to be taken into account, typically, by reducing the temperature applied at the edge of the wafer in comparison to the treatment applied to the bulk wafers. By doing so it becomes possible to minimize slip lines and wafer deformation, which would otherwise occur. U.S. Pat. No. 6,853,802 proposes to adapt the thermal treatment by determining the heat absorption coefficient of the structure to be treated and by adapting accordingly the power supplied to the heating lamps of the equipment. This method does, however, have the problem that the calibration is not achieved in a direct way and that in fact a correlation between the heat absorption coefficients and the equipment parameters needs to be established.

A second way of calibrating the equipment is to perform calibration experiments on actual SOI wafers to sequentially adapt the heating power so that slip lines and wafer deformation are minimized. For example, starting from equipment that has been calibrated for bulk silicon wafers, the sensor offsets, especially the outermost sensor offsets, can be adapted to take into account the different behavior of SOI and bulk wafers. To adapt the sensor offsets, a number of SOI wafers, having the same device layer and oxide layer thicknesses, are used for different values of the sensor offsets and then the slip lines and/or wafer deformation are measured using standard techniques. Finally the sensor offset providing the best results is chosen.

This method, although being a direct way of calibrating, has nevertheless the drawback that calibration requires expensive SOI wafers which will be scrapped at the end of the calibration. As thermal processing equipment suffers from continuous drift, regular recalibration is needed, and calibration using SOI wafers can become too costly to be employed on a regular basis. Finally, this second method is based on the ability to measure and identify slip lines and/or wafer deformation, which is relatively cumbersome and thus not suitable to be carried out on a regular basis.

Thus, there is a need for a calibration method for calibrating thermal processing equipment to be used for heat treatment of a multilayer substrate which easily establishes equipment calibration parameters without an excessive use of multilayer substrates.

SUMMARY OF THE INVENTION

The present invention now provides a method for calibrating a thermal processing equipment with a heating device used for heat treatment of a multilayer substrate. This method generally comprises processing thermally a test substrate having a structure differing from the structure of the multilayer substrate using a set of thermal process parameters in order to form a layer on the test substrate with a thickness profile, comparing the thickness profile of the test substrate with a predetermined thickness profile of a calibration layer formed on a calibration test substrate, wherein the calibration layer is formed using a set thermal process parameters that, when used to process a multilayer structure, produces a predetermined effect, and adjusting the set of thermal process parameters such that the heating device compensates for the differences between the thickness profile and the predetermined thickness profile.

The invention is based on the surprising discovery that a predetermined thickness profile, also called a "golden profile", of a layer that has been thermally processed on a test substrate can be associated with each type of multilayer substrate. The test substrate has a different structure and is usually cheaper than the multilayer substrate for which the thermal processing equipment is to be calibrated.

The golden profile corresponds to the layer thickness profile produced across the diameter of a test substrate that has been processed by thermal processing equipment calibrated for the type of multilayer substrate in question. In case the equipment is to be used for forming layers on the multilayer substrate, the equipment is calibrated to produce a layer with an even thickness profile on the multilayer substrate. Or in case the equipment is to be used for smoothing purposes, the equipment is calibrated to produce a multilayer substrate showing a reduced amount, in particular nearly no or no, slip lines and/or reduced wafer deformation as compared to a multilayer substrate processed in non calibrated equipment.

The predetermined thickness profile, also called golden profile in the following, can be obtained by any suitable technique known in the prior art, for example, ellipsometry.

Once the golden profile is established for a given multilayer substrate, the test substrate can be used anytime a new calibration of thermal processing equipment needs to be carried out. In fact, to calibrate a thermal processing equipment, it is now sufficient to form a layer on a new test substrate, to measure the layer thickness profile produced, and to compare it with the corresponding golden profile. If profile differences are observed, the process parameters can then be amended such that the differences are taken into account. When the amended set of thermal process parameters produces a thickness profile on the test substrate corresponding to the golden profile, the amended set of thermal process parameters will also produce a corresponding multilayer substrate. If the golden profile corresponds to a multilayer substrate with an even thickness profile, then the corresponding multilayer substrate will have an even thickness profile. Or if the golden profile corresponds to a smooth multilayer substrate, then the corresponding multilayer substrate will have reduced slip lines and/or reduced wafer deformations.

Compared to the prior art, it is thus possible to use cheaper test substrates for calibration instead of the expensive multilayer substrates. In addition, thickness profiles on test substrates (golden profiles) are advantageous for regular use because these profiles correlate better with the heating device than do wafer heat absorption coefficients taught in the prior art. Also, thickness profile measurements on the test substrate can be more easily carried out than the slip line and/or wafer deformation measurements also taught in the prior art.

BRIEF DESCRIPTION OF THE DRAWING FIGURES

Figure 2A:
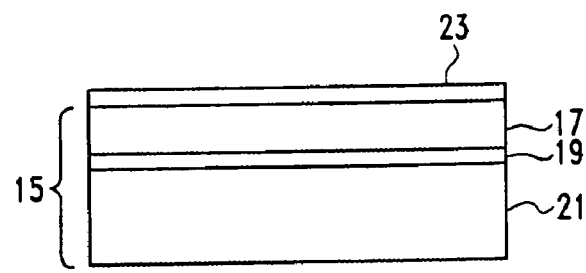
Figure 2B:
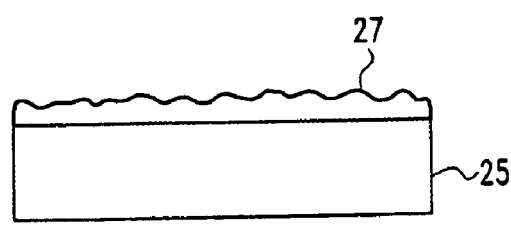
Figure 3A:
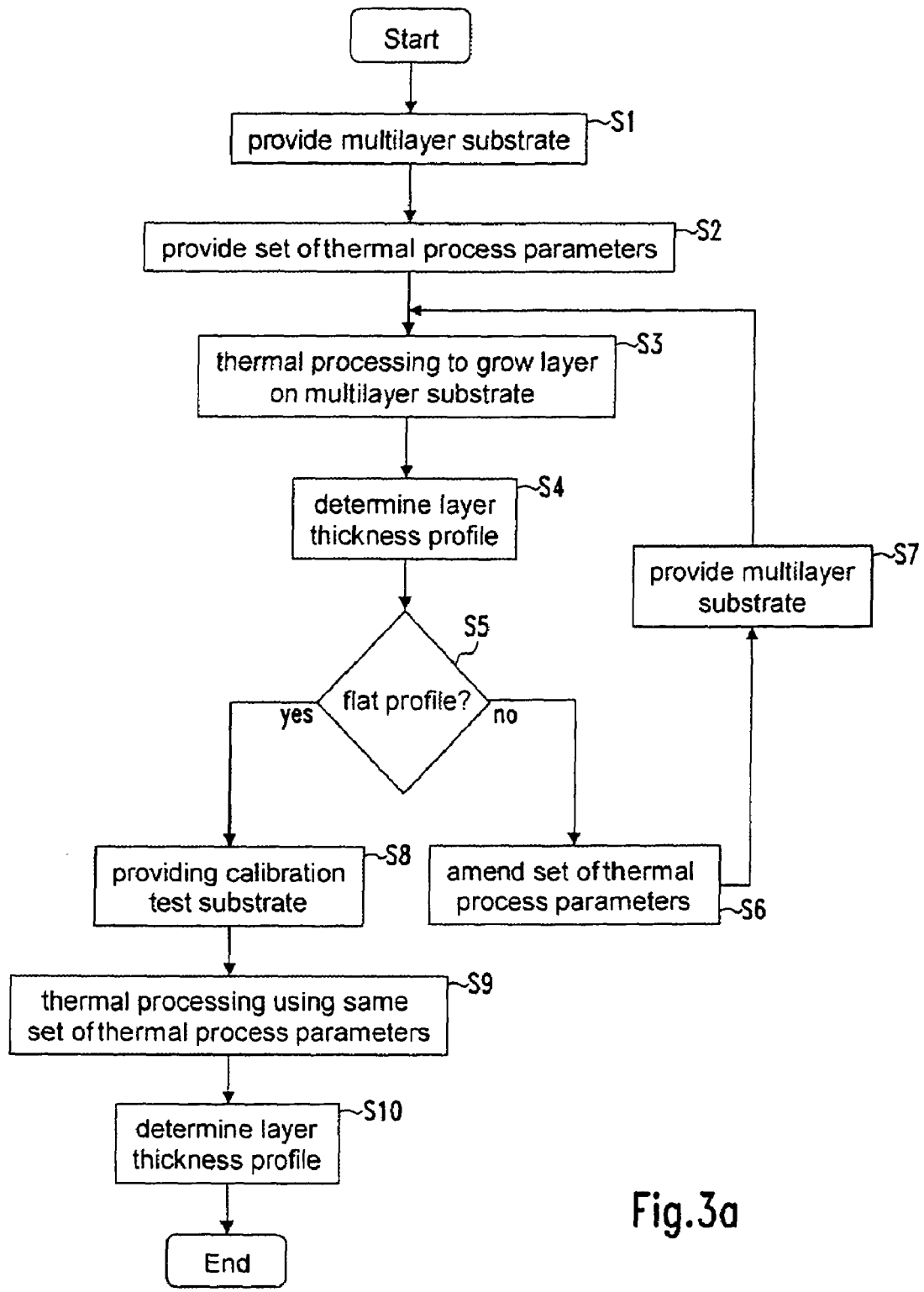
Figure 3B:
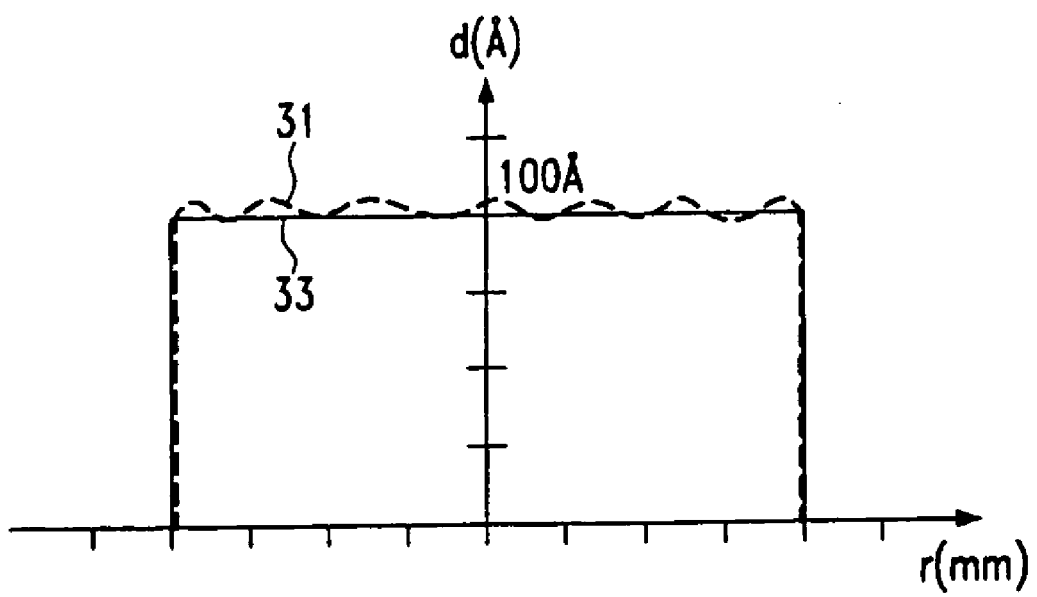
Figure 3C:
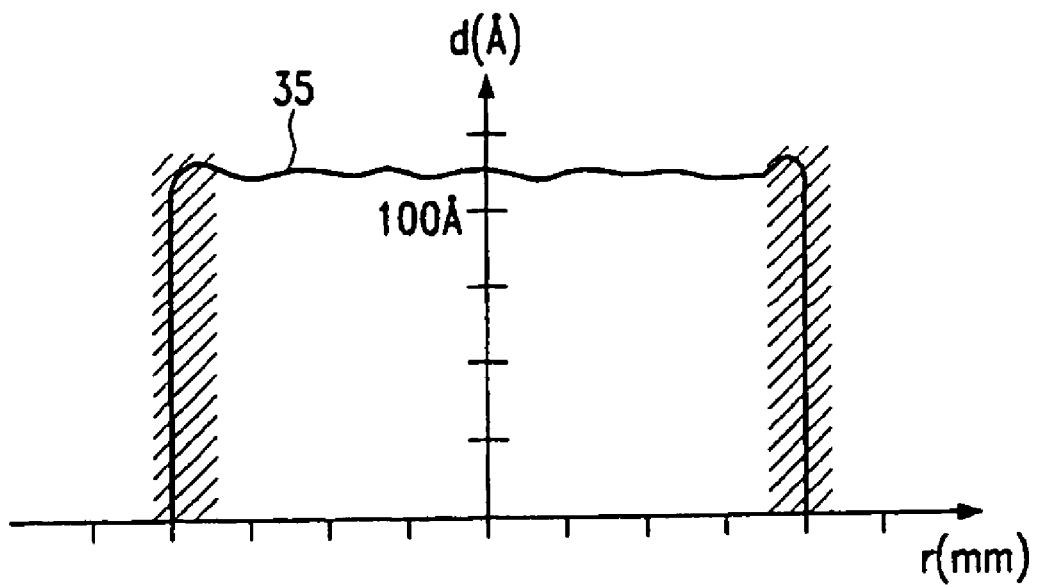
Figure 3D:
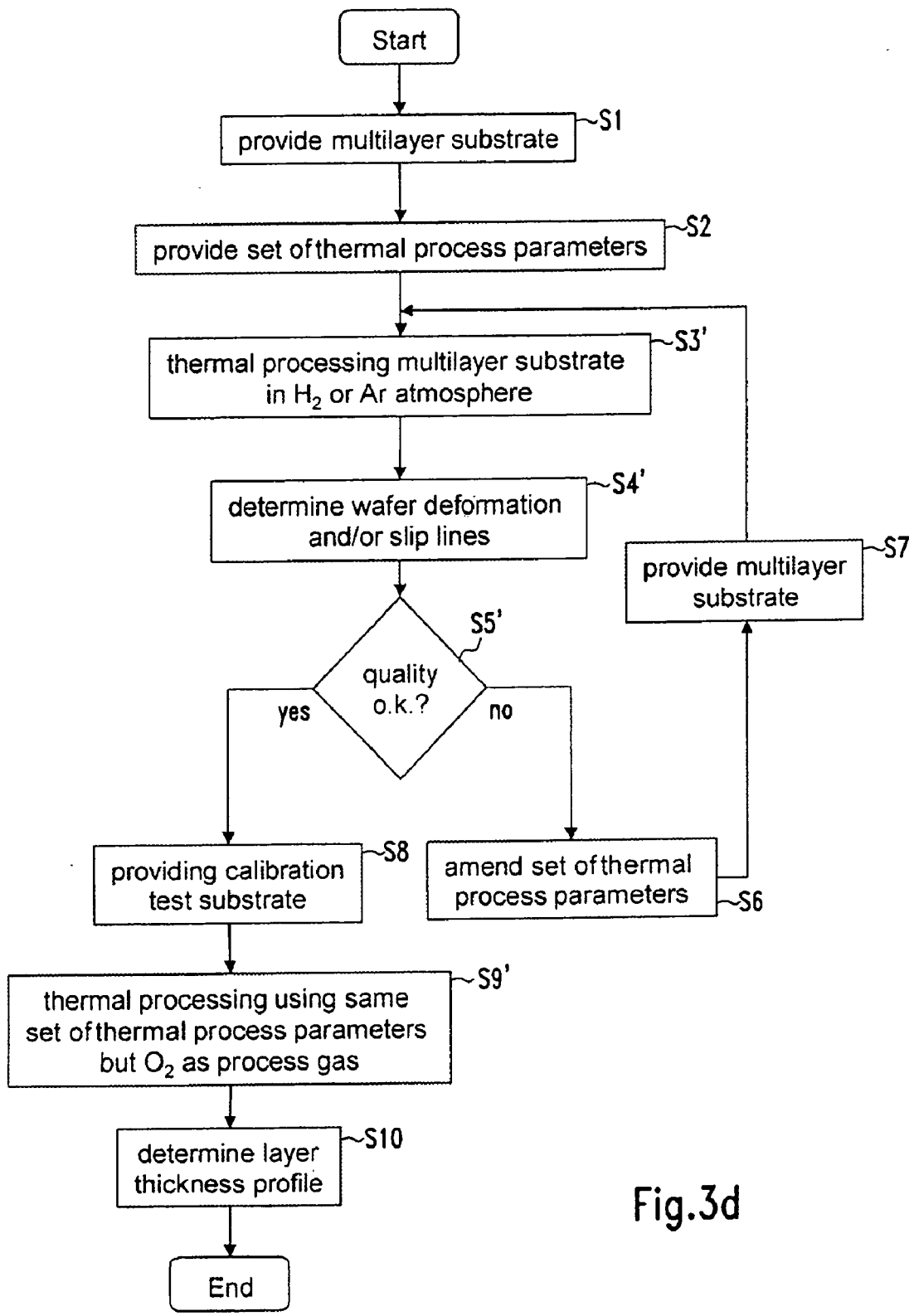
Figure 4A:
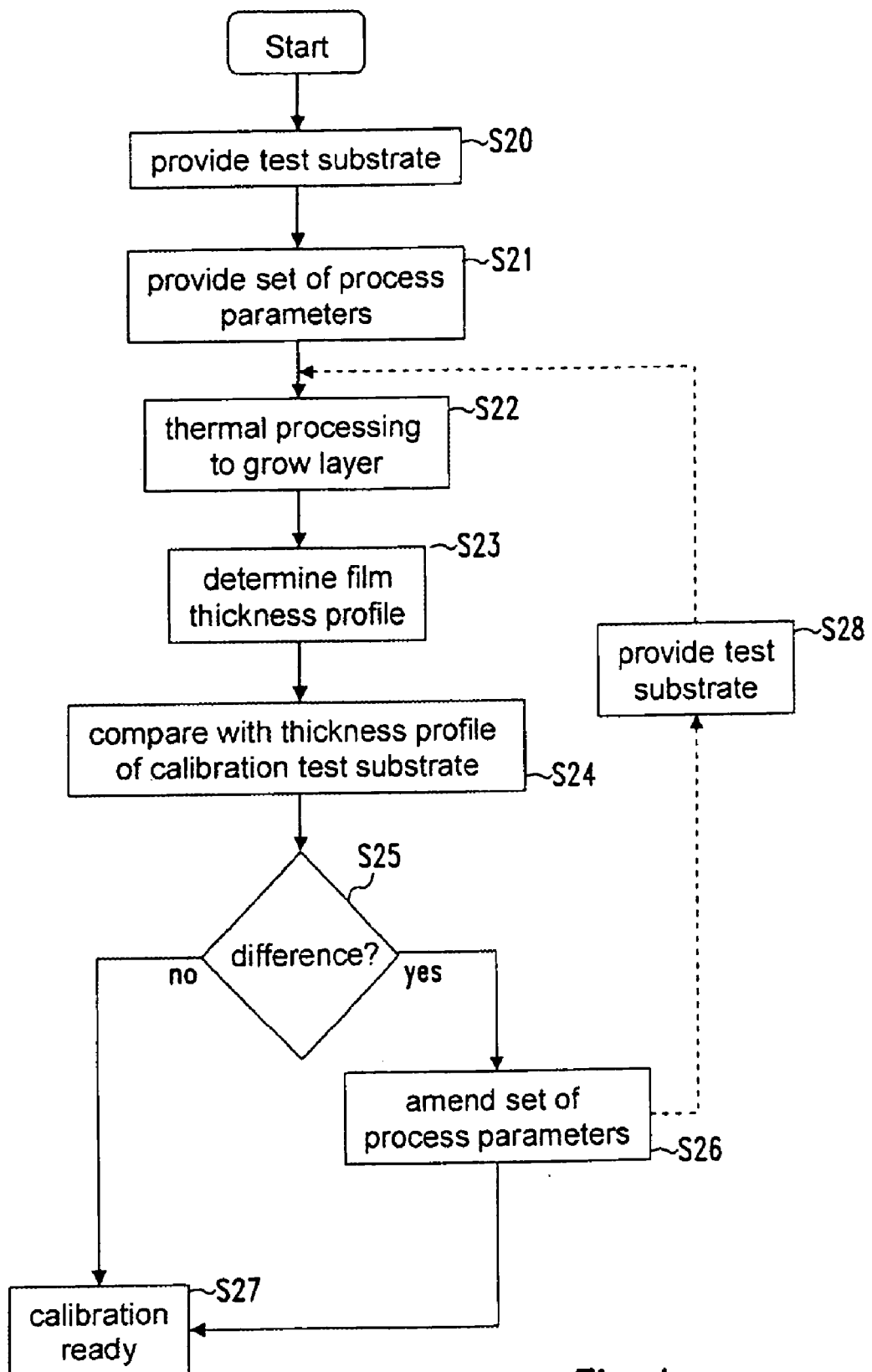
Figure 4B:
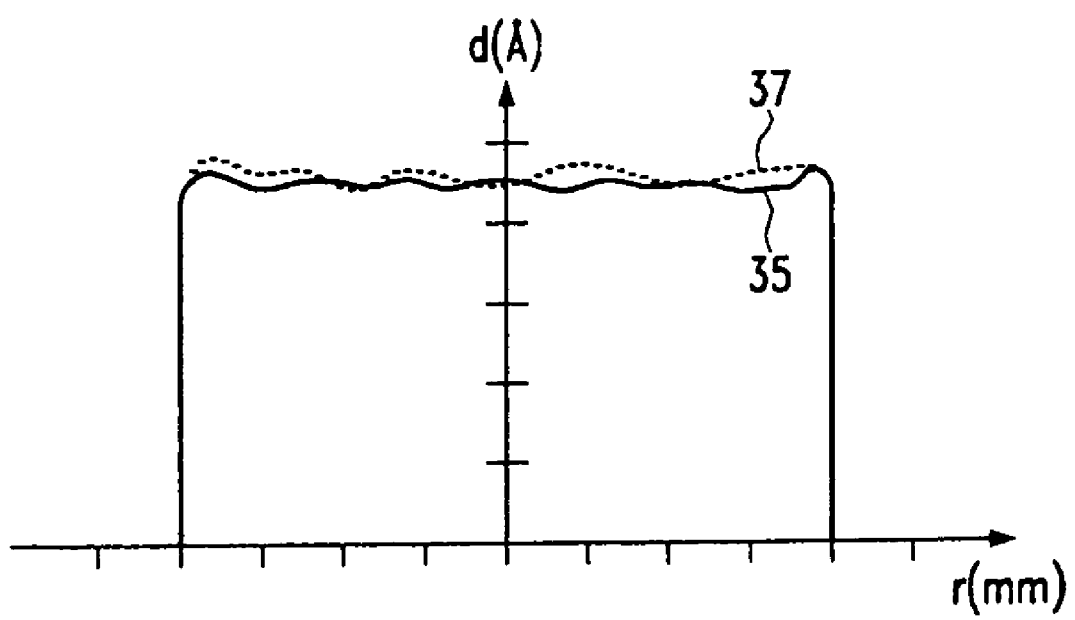

Specific embodiments of the present invention will become apparent from the following detailed description with reference to the accompanying drawings wherein:

FIG. 1 illustrates a thermal processing equipment,

FIG. 2a illustrates a multilayer substrate with a layer having an even thickness profile obtained by thermal processing and, FIG. 2b illustrates a test substrate with a predetermined thickness profile produced under the same process conditions for which an even thickness profile was produced on the multilayer substrate of FIG. 2a, FIG. 3a illustrates a first embodiment of the method to determine a predetermined thickness profile (golden profile), FIGS. 3b and 3c illustrate an even thickness profile on a multilayer substrate and a corresponding predetermined thickness profile (golden profile) of a test substrate respectively, FIG. 3d illustrates a second embodiment of the method to determine a predetermined thickness profile, FIG. 4a illustrates a calibration method, and FIG. 4b illustrates a thickness profile produced on a test wafer compared to the golden profile illustrated in FIG. 3c.

DETAILED DESCRIPTION OF THE PREFERRED EMBODIMENTS

The terms "test substrates" and "calibration test substrates" refer to substrates with the same structure, except that a calibration test substrate is a test substrate that has been used for calibrating a heating device. During calibration of a heating device, the predetermined thickness profile (golden profile) of the calibration layer is formed on the calibration test substrate using the same thermal process parameters which, when used for processing multilayer substrates, produces multilayer substrates with an even thickness profile, or alternatively a multilayer substrate with reduced, in particular nearly no or no, slip lines and/or reduced wafer deformations. The term "thermal process parameters" relates to any controllable parameter of the equipment that influences the heat profile in the equipment.

According to a preferred embodiment, the set of thermal process parameters used to process a test substrate correspond to a set of predetermined thermal process parameters that have been used to process multilayer substrates. Since drift alters the process conditions in a thermal process equipment in a slow and steady way, the optimized (adapted) thermal process parameters are usually close the predetermined thermal process parameters.

According to a preferred embodiment the predetermined thickness profile (golden profile) can be determined using a different thermal processing equipment. If in one thermal processing equipment the golden profile corresponds to producing a layer with a flat (even) thickness profile, the same will also be true if the same multilayer substrates are processed in a different equipment processing. Similarly, if in one equipment the golden profile corresponds to a multilayer substrate with reduced slip lines and/or reduced wafer deformation after smoothing, the same will also be true for the same multilayer substrates processed in a different equipment. Preferably, the two thermal processing equipments are of the same equipment type or model.

Therefore, the golden profile can preferably be determined once for a thermal processing equipment of one type and can then be reused for other thermal processing equipment of that type. This can further reduce the costs of equipment calibration.

According to preferred embodiment, an amended set of thermal process parameters, determined as already described, can be validated by using them to thermally process a second test substrate. This limits processing of multilayer substrates with thermal processing equipment that still requires some calibration. Further, it can be preferable to check again whether the amended thermal processing parameters are suitable by verifying again the amendment to the thermal process parameters. A further test substrate is thermally processed obtaining a further thickness profile, and the further thickness profile is again compared to the golden profile. In case a difference is still present, amendments to the thermal process parameters of the heating device can then be further fine tuned by processing one or more further test wafers.

According to preferred embodiment, the thermal processing equipment comprises a plurality of heaters for locally heating a substrate and a plurality of probes for locally measuring the temperature of the test substrate. In such equipment, amending a set of thermal process parameters comprises individually adapting the heat provided by each of the plurality of heaters. In thermal processing equipment where each probe corresponds to a heater or to a group of heaters, amendments to the thermal processing parameters can be performed in those locations in the thickness profile where differences with respect to the golden profile are observed. Preferably, the heat produced by each heater can be individually adapted by individually amending the offset values of the one or more probes that correspond to each heater. This advantageously implements localized adaptation of the heat provided to the substrate.

According to preferred embodiment, the surface layer of the multilayer substrate and that of the test substrate can be of the same material. In this case, the calibration method of this invention can often more precisely minimize differences between a golden profile and a profile produced on a test substrate since the physics and/or chemistry of layer formation are comparable.

According to preferred embodiment, the surface layer of the multilayer substrate and that of the test substrate have the same crystalline structure. Also in this case, the calibration method of this invention can often more precisely minimize differences between a golden profile and a profile produced on a test substrate since the crystalline structure plays an important role in the growth of an additional layer.

According to preferred embodiment, the multilayer substrate can be a silicon on insulator (SOI) type wafer and the test substrate can be a silicon wafer. Silicon wafers are usually standard high volume products which are readily available with good quality and relative low prices, whereas SOI wafers are usually expensive.

According to preferred embodiment, the heat treatment applied to a multilayer substrate can be a rapid thermal annealing treatment or a rapid thermal oxidation treatment. Due to the high temperatures and the short processing times in these treatments, calibrated processing equipment is crucial for the success, as only small local differences in temperature can lead to a negative impacts on the product. The advantageous, economical calibration methods of this inventions can often achieve high production yields in these and other thermal processing processes.

According to preferred embodiment, the predetermined thickness profiles (golden profiles), which are advantageously employed in the calibration of thermal processing equipment as described above, can be measured using standard prior art techniques, for example, ellipsometry. Preferably, the calibration thickness profile can be determined with a higher resolution at the edges of the calibration test substrate than in the center regions of the calibration test substrate. As already explained above, the main differences in thermal processing between a multilayer substrate and a bulk type test substrate arise in the edge areas. It is therefore of interest to have more data available in this region to obtain better calibration of the thermal processing equipment, especially for the critical edge region. Such better calibration is based on the more numerous measurement points which can be compared to the golden profile.

According to preferred embodiment, the calibration thickness profile can be determined for a plurality of different multilayer substrates. Golden profiles can be determined for various multilayers including different materials and thicknesses, so that for each multilayer substrate the optimum golden profile can be used for the calibration of the heating devices of a thermal processing equipment. In addition, a plurality of golden profiles can be determined for a multilayer substrate of a certain type, the different profiles corresponding to different intended effects, such as for forming additional layers and/or for smoothing operations. In addition, golden profiles can be determined for thermal processing equipment of different types or models.

According to preferred embodiment, the calibration thickness profiles (golden profiles) can be stored in a database. In this case anytime a thermal processing equipment needs to be calibrated for a given multilayer substrate, the operator or the equipment itself can choose the corresponding golden profile and carry out the calibration. This furthermore helps in reducing the time necessary to carry out the calibration, as at anytime the necessary data can be read out from the database.

Furthermore, the invention also relates to a calibration test substrate comprising a layer thermally formed on one of its main surfaces with a predetermined thickness profile. The predetermined thickness profile of the thermally formed layer is preferably produced with a set of thermal process parameters for which a layer with an even thickness profile is produced on a multilayer substrate or a multilayer substrate is produced with reduced slip lines and/or reduced deformation. Using the predetermined thickness profile of this calibration test substrate, the calibration methods described above can be carried out.

FIG. 1 illustrates a typical thermal processing equipment used in the semiconductor industry to heat treat substrates, in particular wafers, to form layers, and/or to anneal. In multilayer substrate fabrication such equipment also plays a role in surface smoothing.

The thermal processing equipment 1 illustrated can be of a vertical or horizontal thermal reactor type and can be either a batch or a single wafer type. The thermal processing equipment 1 comprises a furnace chamber 3 in which are arranged a plurality of heaters 5, a plurality of probes 7 for locally measuring the temperature of a substrate 9 which is positioned on a support means 11. As shown in FIG. 1, the number of probes 7 does not necessarily have to be the same as the number of individual heaters 5. Here more probes 7 than individual heaters 5 are indicated. The furnace 1 furthermore comprises a control unit 13 which based on the individual temperatures measured by the probes 7 controls the heat provided by the individual heaters 5.

For the proper use of the thermal processing equipment 1, the heaters 5 preferably provide a uniform temperature distribution across the substrate 9, so that the layer growth or annealing carried out with this equipment is in turn also uniform or at least optimized. In this case, when used to form a layer over the substrate 9, the layer produced will show an even thickness profile. For example, an oxide layer is produced by providing an oxygen containing gas to the chamber of a calibrated heat treatment equipment. When used for smoothing purposes with hydrogen or argon replacing oxygen, the substrate 9 will show a reduced number of, in particular nearly no or no, slip lines and/or a reduced deformation.

Thermal processing equipment, like the one illustrated in FIG. 1, needs to be initially calibrated and then recalibrated from time to time to correct for drift of its heating properties. Under production conditions, such a recalibration usually needs to be carried out at least once a week.

FIG. 2a illustrates a multilayer substrate 15, for example, a silicon on insulator (SOI) type substrate, with a device layer 17 on an oxide layer 19 which in turn is provided on a silicon substrate 21. This SOI substrate 15, however, is only exemplary, and other multilayer structures, for example strained silicon on insulator or germanium on insulator multilayer substrates, can be processed according to this invention. The illustrated multilayer substrate 15 has been heat treated in a thermal processing equipment 1 in an oxygen atmosphere, like that described above with respect to FIG. 1, so that a layer 23, for instance an oxide layer, is formed on the multilayer substrate 15, namely on the device layer 17. When using a correctly calibrated thermal processing equipment, this layer 23 has an even thickness profile over essentially the whole surface of the multilayer substrate 15.

FIG. 2b illustrates a test substrate 25, here a silicon (Si) wafer, on which layer 27 has been formed using the same thermal processing equipment 1 in the calibrated state controlled by the same thermal process parameters. Compared to layer 23 with an even thickness profile, this layer 25 shows a different thickness profile, which is illustrated in FIG. 2b in an exaggerated manner. This is due to the fact that the bulk Si substrate 25 behaves differently from the multilayer substrate 15 with respect to the growth of the layers 27 and 23, respectively. In the state of the art this difference has been attributed to local differences in heat absorption coefficients. See, e.g., U.S. Pat. No. 6,853,802.

As mentioned earlier, the thermal processing equipment 1 needs to be calibrated prior to the first use and then also recalibrated from time to time. In the prior art this is done using a multilayer substrate 15 and growing an oxide layer on it, then measuring the thickness profile, and individually calibrating the heaters 5 by, for example, changing the offsets of the corresponding probes 7. Another prior art method is to identify the heat absorption coefficient locally and starting from there, controlling the heat provided locally.

However, the present invention uses a test substrate 25, preferably different from the multilayer substrate, to calibrate the thermal processing equipment 1. Thus, use the more expensive multilayer substrates 13 for calibration purposes is not needed.

This will now be explained in detail in the following for the case that a layer, like layer 23 in FIG. 2a, is formed on the multilayer substrate. The inventive calibration method is based on the idea that the thickness profile of layer 27 of test substrate can be used to calibrate the thermal processing equipment 1. When the thermal processing equipment is calibrated to produce a layer on the test substrate 25 having a predetermined calibration thickness profile, then the equipment will produce an even thickness profile upon processing a multilayer substrate 13.

FIG. 3a illustrates one embodiment of a method for creating a calibration thickness profile used for the calibration of a thermal processing equipment according to the invention. Reference will be made to the equipment and substrates illustrated in FIGS. 1, 2a and 2b. Their properties will not be repeated again but are incorporated by reference. However, other thermal processing equipment, for example, an epitaxial deposition tool, and other substrates could also be used.

In step S1 a multilayer substrate 15 to be calibrated is provided in thermal processing equipment 1 and is positioned on the support means 11. Then in step S2 a set of thermal process parameters is provided to the control unit 13. Then in step S3 an oxide layer is thermally formed on the multilayer substrate 15, for instance a layer of a thickness of about 100 Å. This is achieved by providing oxygen to the chamber 3 with heat controlled by the thermal process parameters.

Then in step S4 the thickness profile of the thermally formed layer 23 is determined. This is done using standard thickness measurement methods, for example, ellipsometry. FIG. 3b illustrates with dotted lines such a thickness profile 31 produced by a non-calibrated thermal processing equipment. In FIG. 3b the thickness d (measured in Å) is plotted on the y-axis, whereas on the x-axis the distance to the center of the multilayer substrate 15 is plotted. Actually the illustrated thickness is along a diameter of the multilayer substrate 15, alternately a two-dimensional thickness profile can be determined. As can be seen from FIG. 3b, in the non-calibrated state, the thickness produced varies around a value of 100 Å, which is an indication that the heat distribution is not sufficiently even.

In step S5 it is checked whether a flat (even) profile has been achieved or not. When an uneven thickness profile is produced, such as thickness profile 31 (dotted line in FIG. 3b), the decision taken is "no", and as a consequence the process continues with step S6 which amends the set of thermal process parameters in the control unit 13. For positions where the thickness exceeds 100 Å, the corresponding heaters 5 are adjusted to provide less heating power, which can, for example, be realized by changing the offset of the probes, and at positions where the thickness is less than 100 Å, more heating power is provided to the corresponding heaters 5.

In step S7 a new multilayer substrate 15 is provided in the thermal processing equipment 1 and the steps S3 and S4 are repeated, now with the amended set of thermal process parameters. In fact, the steps S3 to S7 are repeated until in step S5 a flat thickness profile 33 is observed. Such a flat or even thickness profile 33 on a multilayer substrate 15 is illustrated in FIG. 3b with a solid line. When a flat thickness profile is observed, the thermal processing equipment 1 is in a calibrated state.

In step S8 a test substrate 25, in the following called a calibration test substrate, is provided and positioned in the calibrated thermal processing equipment 1. Then (step S9) a layer 27 is formed on the calibration test wafer 25 using the set of thermal process parameters which produced the even thickness profile on the multilayer substrate 15 (the latter being illustrated profile 33 in FIG. 3b (solid line)).

Then in step S10 the thickness profile of the layer 27 formed on the calibration test substrate 25 is determined, for example, in the same way as the thickness profile of the layer formed on the multilayer substrate 15. The corresponding thickness profile 35 is illustrated in FIG. 3c, where again the measured thickness is plotted on the y-axis and the distance to the center of the calibration test substrate 25 is plotted on the x-axis. As can be seen from FIG. 3c the same thermal process parameters that produce an even thickness profile 33 on a multilayer substrate 15 produce a different thickness profile 35 on the calibration test substrate 25. This is due, at least, to the differences in the heat absorption coefficients between the two substrates which in turn is due to the different structures between the test substrate 25 and the multilayer substrate.

Now this profile 35 is used in the following as a calibration thickness profile, here also called golden profile or predetermined thickness profile, when recalibrating a thermal processing equipment. As the main differences occurring in the even thickness distribution 33 of the multilayer substrate shown in FIG. 3b are generally found in the edge region (cross hatched part of FIG. 3c), it is advantageous to measure the thickness profile with a higher resolution in the edge region of the calibration test substrate.

The measured golden profile 35 can then be stored in a database such that it is easily transferable from one thermal processing equipment to another. Furthermore this database may comprise golden profiles for different types of multilayer substrates. In particular golden profiles for device layers 17 of different materials and thicknesses, for oxide layers 19 of different thicknesses and for different base substrates 21, for equipment of different types, for different predetermined or intended effects, and the like.

FIG. 3d illustrates a second embodiment of the method for creating a calibration thickness profile used for the calibration of a thermal processing equipment according to the invention. When the thermal equipment is used for smoothing purposes, process steps S3, S4, S5 and S9 are changed in comparison to the corresponding process steps in the first embodiment. The other steps are the same as in the first embodiment, and their description is not repeated again but is incorporated by reference.

In this embodiment, surface smoothing step S3' is carried out with hydrogen ($H_2$) or argon (Ar) in the furnace chamber 3 instead of oxygen as in the previous embodiment. In SOI substrate production this step is for example carried out to improve the surface quality of the product. As, however, thermal non-uniformities present in non-calibrated equipment lead to the formation of slip lines and/or wafer deformation, a calibration also is necessary. Therefore in Step S4' the multilayer substrate is analyzed to measure wafer deformation and slip line formation. This is done using standard methods. Then in step S5' it is checked whether the results are sufficiently good to insure the necessary product quality, in particular, whether the number of slip lines is reduced and/or whether reduced wafer deformation is observed compared to that which is obtained in uncalibrated equipment (in which slip lines and/or wafer deformation occur due to thermal non-uniformities). If this is the case the process continues with step S8, wherein during step S9' the gas supply is switched back to oxygen ($O_2$) to form an oxide layer on the test substrate. If this is not the case the process continues with step S6 as described above.

Slip lines are typically measured using inspection tools. The measurement is expressed in total millimeters over the substrate (wafer). It is the aim of the calibration according to this embodiment to achieve a minimized number of slip lines, in particular zero slip lines.

Wafer deformation is typically measured by warp and bow measurements and, if wafer deformation is considered during calibration, it is again the aim to optimize the calibration by minimizing the deformation (expressed in µm) or to even achieve zero deformation.

FIG. 4a illustrates an embodiment of a method for calibrating thermal processing equipment according to the invention. Again reference will be made to the thermal processing equipment 1, the multilayer substrate 15 and the test substrate 25 as shown in FIGS. 1, 2a and 2b. Their properties will not be repeated again but are incorporated by reference. However, other thermal processing equipment and substrates could also be used.

The inventive calibration method takes advantage of the golden profile 35 as determined by the above-described processes (see FIGS. 3a to 3c). In step S20 a test substrate 25 is provided in the thermal processing equipment 1. Then in step 21 a set of thermal process parameters is provided to the control unit 13 of the thermal processing equipment 1 which is used to control the heating device with the plurality of heaters 5.

The thermal processing equipment being calibrated can be the same thermal processing equipment as the equipment in which the golden profile 35 has been determined on the calibration test substrate. In a variant, the thermal process equipment being calibrated can be a thermal processing equipment different than the equipment in which the golden profile 35 has been determined. In this variant, it is preferable that the thermal processing equipment to be calibrated is of the same equipment type as the thermal processing equipment in which the golden profile was determined. In another variant, the set of thermal process parameters can be the set of thermal process parameters for which the golden profile has been determined as described above with respect to FIG. 3a.

In step S22 the test substrate 15 is then thermally processed to form a layer thereon. Then in step S23 the thickness profile of the layer is determined using standard thickness measurements, like ellipsometry. The corresponding thickness profile 37 is illustrated in FIG. 4b, where the thickness of the layer is plotted on the y-axis and the distance with respect to the center of the test substrate 15 is plotted on the x-axis. The determined thickness profile 37 is traced in dotted lines on FIG. 4b. The corresponding golden profile 35 is plotted with a continuous (solid) line and corresponds to the one already illustrated in FIG. 3c.

From the difference in the two profiles it can be concluded that the thermal processing equipment needs recalibration. In fact, only when the thickness profile 37 (dotted line) of the layer on the test substrate and the predetermined thickness profile 35 (golden profile illustrated with a solid line) of a calibration layer on a calibration test substrate correspond to each other will the thermal processing produce intended multilayer substrates. Intended multilayer substrates can either have layers with even thicknesses profile 33, or can be multilayer substrates with a reduced amount of, in particular nearly no or no, slip lines and/or a reduced wafer deformations.

In step S25 it is decided whether the thickness profiles correspond to each other or not. If a difference is observed the method for calibrating the thermal processing equipment continues with step S26. This step consists in amending the set of thermal process parameters such that the heating device is adapted to compensate the differences observed between the thickness profile 37 and the predetermined thickness profile (golden profile) 35 of the calibration layer. Once this is done, the calibration is ready (step S27) and the process for calibrating comes to an end. If the two profiles 35, 37, however, correspond to each other the calibration immediately ends as no recalibration is necessary.

According to a variant, it is also possible to provide an additional test substrate when the set of thermal process parameters (step S28) has been amended, and then to carry out again steps S22 to S24 in order to verify that, indeed, the amended thermal process parameters are such as to produce a thickness profile corresponding to the golden profile on the additional test substrate.

The adapting of the thermal process parameters is carried out by changing the heating power provided to the heaters 5 of the heating device of the thermal processing equipment 1. In fact, each heater 5 can be controlled individually such that local control of heating can be realized. Changing the heating power can be done by directly influencing the heaters or by changing the offset of the corresponding probes 7 measuring the temperature on the substrate.

In the figures the method for calibrating the thermal processing equipment 1 and the method for creating a calibration thickness profile have been explained using a SOI multilayer substrate and a Si wafer as a test substrate 25. However, the present invention is not limited to these material choices but other types of multilayer substrates and/or test substrates can be used in the same way. In such cases, it is advantageous to carry out calibration with a test substrate having the same material as the surface layer of the multilayer substrate, or with a test substrate having the same crystalline structure as the surface layer of the multilayer substrate. In cases where a bulk substrate of the proper material is not available or is comparatively expensive, a low cost Si wafer can still be used as test substrate.

The disclosed methods for calibrating thermal processing equipment and for creating calibration thickness profiles are of particular interest when the thermal processing equipment is used for rapid thermal annealing treatments, e.g., treatment in hydrogen (H) or argon or a mixture of H and Ar gases, or rapid thermal oxidation treatments. For those treatments a well calibrated equipment is necessary as high temperatures are involved and only small deviations from an even temperature distribution can have an impact on the quality of the layers formed or annealed.

Finally, the test substrate 25 with the layer 27 having the golden profile, as shown in FIG. 2b, represents one embodiment of a calibration test substrate according to this invention, as the thermally formed layer thereon is produced with the set of thermal process parameters for which a layer 23 with an even thickness profile has been achieved on the multilayer substrate 15 shown in FIG. 2a.

The invention described and claimed herein is not to be limited in scope by the preferred embodiments herein disclosed, since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims.

A number of references are cited herein, the entire disclosures of which are incorporated herein, in their entirety, by reference for all purposes. Further, none of these references, regardless of how characterized above, is admitted as prior to the invention of the subject matter claimed herein.

What is claimed is:

1. A method for creating a calibration thickness profile used for calibrating a thermal processing equipment, the thermal processing equipment comprising a heating device for heating a substrate controlled by a set of thermal process parameters, the method comprising:
   calibrating the thermal processing equipment by adjusting the thermal process parameters so that thermal processing of a multilayer substrate produces a predetermined effect,
   forming a layer on a calibration test substrate by thermally processing using the calibrated set of thermal process parameters, the calibration test substrate comprising a structure different than the structure of the multilayer substrate, and
   determining the calibration thickness profile as the thickness profile of the layer formed on the calibration test substrate, wherein the calibration thickness profile is determined with a higher resolution at an edge region of the calibration test substrate than in a center region of the calibration test substrate.

2. The method of claim 1, wherein the calibration thickness profile is determined for a plurality of different multilayer substrates.

3. The method of claim 1, further comprising storing the calibration thickness profile in a database.

4. The method of claim 1, wherein the multilayer substrate comprises a SOI type wafer and the test substrate comprises an Si wafer.

5. A method for calibrating a thermal processing equipment used for a heat treatment of a multilayer substrate, the thermal processing equipment comprising a heating device for heating a substrate controlled by a set of thermal process parameters, the method comprising:
   processing thermally a test substrate having a structure differing from the structure of the multilayer substrate using a set of thermal process parameters in order to form a layer on the test substrate with a thickness profile,
   comparing the thickness profile of the test substrate with a predetermined thickness profile of a calibration layer formed on a calibration test substrate, wherein the calibration layer is formed using a set thermal process parameters that, when used to process a multilayer structure, produces a predetermined effect, and
   adjusting the set of thermal process parameters such that the heating device compensates for the differences between the thickness profile and the predetermined thickness profile,
   wherein the calibration thickness profile is determined with a higher resolution at an edge region of the calibration test substrate than in a center region of the calibration test substrate.

6. The method of claim 5 wherein the calibration layer is non-uniform or uneven.

7. The method of claim 5 wherein the thickness profile of the test substrate is measured over a plurality of points on the surface of the wafer.

8. The method of claim 5, wherein the set of thermal process parameters corresponds to a set of previously adjusted thermal process parameters.

9. The method of claim 5, wherein the predetermined thickness profile has been obtained in a different thermal processing equipment.

10. The method of claim 5, further comprising processing thermally a second test substrate using the amended set of thermal process parameters in order to validate the calibration.

11. The method of claim 5, wherein the thermal processing equipment comprises a plurality of heaters for locally heating the test substrate and a plurality of probes for locally measuring the temperature of the test substrate, and wherein adjusting the thermal process parameters further comprises individually adapting the heat provided by each of the plurality of heaters.

12. The method of claim 11, wherein the heating power of each heater is individually adapted by individually adjusting the offset values of the plurality of probes.

13. The method of claim 5, wherein the surface layer of the multilayer substrate and of the test substrate are of the same material.

14. The method of claim 5, wherein the surface layer of the multilayer substrate and the test substrate have the same crystalline structure.

15. The method of claim 5, wherein the multilayer substrate comprises a silicon on insulator (SOI) type wafer and the test substrate comprises a silicon wafer.

16. The method of claim 5, wherein the heat treatment of the multilayer substrate comprises rapid thermal annealing.

17. The method of claim 5, wherein the heat treatment of the multilayer substrate comprises rapid thermal oxidation.

18. The method of claim 17, wherein the predetermined effect corresponds to an even thickness profile of a layer formed on a multilayer substrate.

19. The method of claim 1, wherein the calibration layer is non-uniform or uneven.

20. The method of claim 1, wherein the thickness profile of the test substrate is measured over a plurality of points on the surface of the wafer.

21. The method of claim 20, wherein the set of thermal process parameters corresponds to a set of previously adjusted thermal process parameters.

22. The method of claim 1, wherein the predetermined thickness profile has been obtained in a different thermal processing equipment.

23. The method of claim 1, further comprising processing thermally a second test substrate using the amended set of thermal process parameters in order to validate the calibration.

24. The method of claim 1, wherein the thermal processing equipment comprises a plurality of heaters for locally heating the test substrate and a plurality of probes for locally measuring the temperature of the test substrate, and wherein adjusting the thermal process parameters further comprises individually adapting the heat provided by each of the plurality of heaters.

25. The method of claim 24, wherein the heating power of each heater is individually adapted by individually adjusting the offset values of the plurality of probes.

26. The method of claim 1, wherein the surface layer of the multilayer substrate and of the test substrate are of the same material.

27. The method of claim 1, wherein the surface layer of the multilayer substrate and the test substrate have the same crystalline structure.

28. The method of claim 1, wherein the multilayer substrate comprises a silicon on insulator (SOI) type wafer and the test substrate comprises a silicon wafer.

29. The method of claim 1, wherein the heat treatment of the multilayer substrate comprises rapid thermal annealing.

* * * * *